United States Patent
Yeh et al.

(10) Patent No.: US 9,245,603 B2
(45) Date of Patent: Jan. 26, 2016

(54) INTEGRATED CIRCUIT AND OPERATING METHOD FOR THE SAME

(71) Applicant: MACRONIX INTERNATIONAL CO., LTD., Hsinchu (TW)

(72) Inventors: Teng-Hao Yeh, Hsinchu (TW); Hang-Ting Lue, Zhubei (TW); Yen-Hao Shih, New Taipei (TW); Chih-Chang Hsieh, Hsinchu (TW); Chih-Wei Hu, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 120 days.

(21) Appl. No.: 14/058,328

(22) Filed: Oct. 21, 2013

(65) Prior Publication Data

US 2015/0109844 A1   Apr. 23, 2015

(51) Int. Cl.
*G11C 7/14* (2006.01)
*H01L 27/115* (2006.01)

(52) U.S. Cl.
CPC ............ *G11C 7/14* (2013.01); *H01L 27/1157* (2013.01); *H01L 27/11524* (2013.01); *H01L 27/11551* (2013.01); *H01L 27/11578* (2013.01)

(58) Field of Classification Search
CPC ............... G11C 7/14; H01L 27/11524; H01L 27/11551; H01L 27/1157; H01L 27/11578
USPC .................. 365/63, 185.17; 257/74, 278
See application file for complete search history.

(56) References Cited

U.S. PATENT DOCUMENTS

| | | | | |
|---|---|---|---|---|
| 5,066,997 A * | 11/1991 | Sakurai | ............ | G11C 5/063 257/211 |
| 6,061,222 A * | 5/2000 | Morris | ............ | H01L 23/5223 257/533 |
| 6,906,384 B2 * | 6/2005 | Yamada | ............ | H01L 21/76243 257/202 |
| 7,586,135 B2 * | 9/2009 | Kwon | ............ | H01L 27/0688 257/250 |
| 7,606,073 B2 * | 10/2009 | Ishibashi | ............ | H01L 27/115 365/185.17 |
| 7,773,412 B2 * | 8/2010 | Nazarian | ............ | G11C 5/063 365/185.02 |
| 7,885,114 B2 * | 2/2011 | Park | ............ | G11C 5/063 365/185.17 |
| 7,898,355 B2 * | 3/2011 | Lee | ............ | H01P 3/003 333/1 |
| 7,999,361 B1 * | 8/2011 | Chen | ............ | H01L 23/5225 257/659 |
| 8,331,149 B2 * | 12/2012 | Choi | ............ | G11C 16/0466 257/329 |
| 8,546,869 B2 * | 10/2013 | Lee | ............ | H01L 27/11551 257/319 |
| 8,630,106 B2 * | 1/2014 | Minamoto | ............ | G11C 16/0483 365/185.17 |

(Continued)

FOREIGN PATENT DOCUMENTS

| | | |
|---|---|---|
| TW | 201232705 | 8/2012 |
| TW | 201301446 A1 | 1/2013 |
| TW | 201336053 A1 | 9/2013 |

OTHER PUBLICATIONS

TW Office Action dated May 29, 2015 in corresponding TW application (No. 102137081).

*Primary Examiner* — Vu Le
*Assistant Examiner* — Sung Cho
(74) *Attorney, Agent, or Firm* — McClure, Qualey & Rodack, LLP

(57) ABSTRACT

An integrated circuit and an operating method for the same are provided. The integrated circuit comprises a stacked structure and a conductive structure. The stacked structure comprises a conductive strip. The conductive structure is disposed above the stacked structure and electrically connected to the conductive strip. The conductive structure and the conductive strip have various gap distances between corresponding points of different pairs according to a basic axis.

14 Claims, 5 Drawing Sheets

(56) References Cited

U.S. PATENT DOCUMENTS

| | | | | |
|---|---|---|---|---|
| 8,791,506 B2* | 7/2014 | Taylor | H01L 21/76283 | 257/203 |
| 2004/0159460 A1* | 8/2004 | Passiopoulos | H01P 3/006 | 174/117 FF |
| 2004/0227584 A1* | 11/2004 | Lee | H01P 5/02 | 333/126 |
| 2007/0170589 A1* | 7/2007 | Kato | G11C 16/0483 | 257/758 |
| 2007/0183191 A1* | 8/2007 | Kim | G11C 7/02 | 365/175 |
| 2007/0228383 A1* | 10/2007 | Bernstein | H01L 21/6835 | 257/74 |
| 2007/0247913 A1* | 10/2007 | Park | H01L 29/42332 | 365/185.17 |
| 2008/0073635 A1* | 3/2008 | Kiyotoshi | H01L 27/105 | 257/2 |
| 2009/0072358 A1* | 3/2009 | Otsuka | H01L 23/50 | 257/664 |
| 2009/0097317 A1* | 4/2009 | Willer | G11C 16/0475 | 365/185.17 |
| 2009/0315633 A1* | 12/2009 | Ding | H01L 23/5222 | 333/1 |
| 2010/0226180 A1* | 9/2010 | Chiang | G11C 16/26 | 365/185.13 |
| 2010/0329012 A1* | 12/2010 | Koyama | G11C 5/02 | 365/185.17 |
| 2012/0102444 A1* | 4/2012 | Ding | H01P 1/15 | 716/111 |
| 2012/0182804 A1* | 7/2012 | Hung et al. | | 365/185.13 |
| 2012/0327714 A1 | 12/2012 | Lue | | |
| 2013/0048354 A1* | 2/2013 | Lin | H05K 1/097 | 174/257 |
| 2013/0148423 A1* | 6/2013 | Ueda | G11C 16/10 | 365/185.2 |
| 2014/0152400 A1* | 6/2014 | Rogers | H01G 5/16 | 333/156 |
| 2014/0369126 A1* | 12/2014 | Lee | G11C 16/0483 | 365/185.17 |
| 2015/0076575 A1* | 3/2015 | Wu | H01L 27/1116 | 257/296 |

* cited by examiner

INTEGRATED CIRCUIT AND OPERATING METHOD FOR THE SAME

BACKGROUND

1. Technical Field

The disclosure relates to an integrated circuit and an operating method for the same, and more particularly to an integrated circuit having a conductive structure and an operating method for the same.

2. Description of the Related Art

As critical dimensions of devices in integrated circuits shrink to the limits of common memory cell technologies, and arrays become very large, memory cell within an array can have characteristics that vary in a manner that affects sensing margins. In one trend to achieve high density, designers have been looking to techniques for stacking multiple levels of memory cells to achieve greater storage capacity, and to achieve lower costs per bit. For example, thin film transistor techniques are applied to charge trapping memory technologies. Also, cross-point array techniques have been applied for anti-fuse memory.

In a 3D array, differences in the electrical characteristics of structures on the various levels can lead to differences in the dynamics of programming, erasing, and charge storage, including variations in threshold voltages corresponding to memory states of memory cells on the various levels. Thus, to achieve the same threshold voltages, within acceptable margins for every level, the programming and erasing processes have to be adapted to vary with the level of the target cell in some way. These variations can lead to endurance problems with the memory cells and to other complexities.

In a 3D array, access lines, such as global bit lines, arranged for use to access the various levels of the array can be laid out so that characteristics such as capacitance and inductance encountered by circuits coupled to the access lines can vary depending on the location, such as which level in the array, of the cell being accessed. For example, global bit lines typically extend to decoder circuitry used for reading and writing the memory cells. Differences among the vertical connections to the various levels, and other differences among the levels, can lead to variations in capacitance among the global bit lines. These variations in capacitance affect the global bit line voltages during read, program and erase operations, and can result in specification requirements, such as larger read margins between programmed and erased states, and slower sensing times to account for worst case capacitances.

It is therefore desirable to provide integrated circuit technologies that compensate for variations in cell characteristics within an array.

SUMMARY

According to one aspect of the present disclosure, an integrated circuit is provided. The integrated circuit comprises a stacked structure and a conductive structure. The stacked structure comprises a conductive strip. The conductive structure is disposed above the stacked structure and electrically connected to the conductive strip. The conductive structure and the conductive strip have various gap distances between corresponding points of different pairs according to a basic axis.

According to another aspect of the present disclosure, an operating method for an integrated circuit is provided. The integrated circuit comprises a 3D memory stack and a conductive structure. The 3D memory stack comprises a dummy region and a memory region adjacent to the dummy region. Each of the dummy region and the memory region comprises a stacked structure, a dielectric layer, a first conductive layer and a second conductive layer. The stacked structure comprises a conductive strip. The first conductive layer is electrically insulated from the conductive strip by the dielectric layer. Opposing ends of the conductive strip are respectively electrically connected to the second conductive layer and the conductive structure. The first conductive layer is disposed between the opposing ends of the conductive strip. The operating method comprises following steps. A first voltage is applied to the conductive structure of the dummy region. A second voltage is applied to the second conductive layer of the dummy region. The first voltage is equal to the second voltage.

The above and other aspects of the disclosure will become better understood with regard to the following detailed description of the non-limiting embodiment(s). The following description is made with reference to the accompanying drawings.

DETAILED DESCRIPTION

Figure 1:
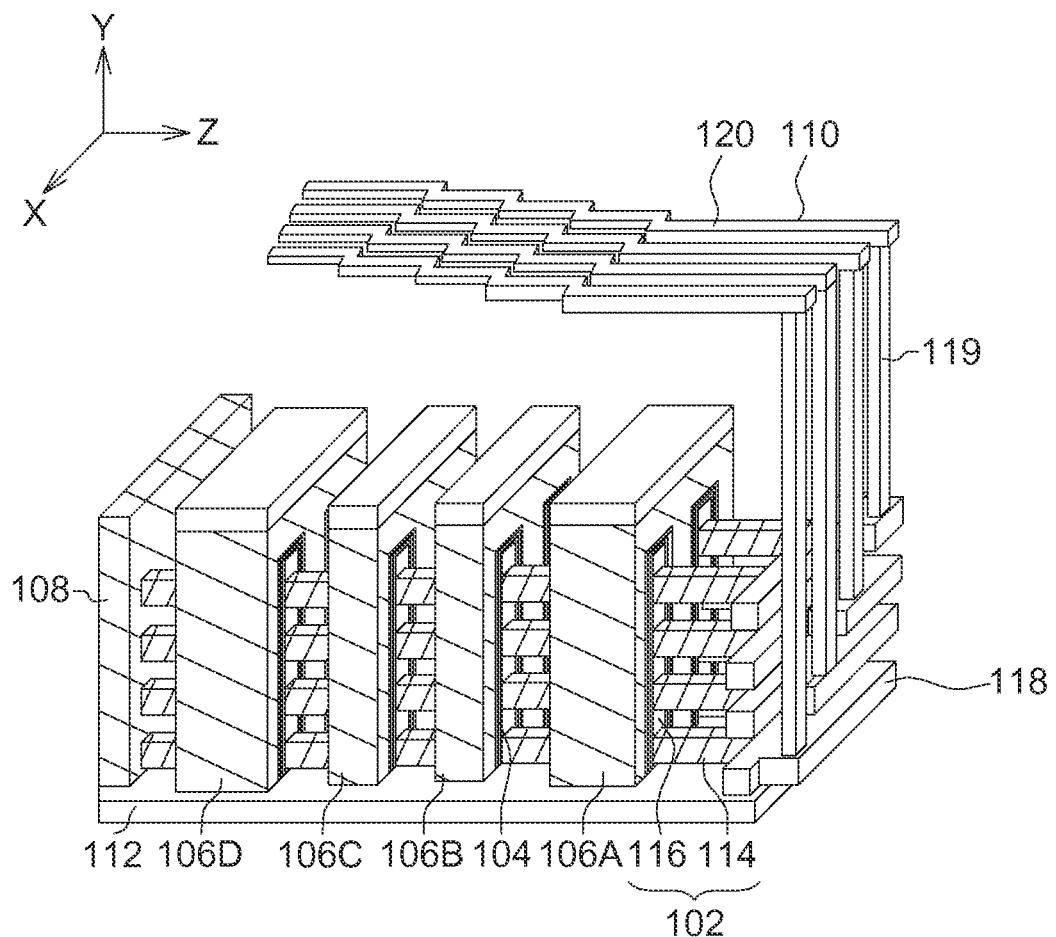
FIG. 1 shows an integrated circuit according to one embodiment.

FIG. 1 shows an integrated circuit according to one embodiment. The integrated circuit comprises a 3D memory stack comprising stacked structures 102, a dielectric layer 104, first conductive layers 106A, 106B, 106C, 106D and a second conductive layer 108. The integrated circuit also comprises a conductive structure 110.

Referring to FIG. 1, the stacked structure 102 of different rows, for example extending along a Z direction, are separated from each other and disposed on a substrate 112. Each of the stacked structures 102 comprises conductive strips 114 and dielectric strips 116 stacked in a stagger manner and having a straight strip shape. The dielectric strip 116, similar with the conductive strip 114, is a straight strip structure extended continuously. FIG. 1 does not show portions of the dielectric strip 116 between the first conductive layers 106A, 106B, 106C and 106D and the second conductive layer 108 for the sake of brevity of the integrated circuit of one embodiment.

Opposing ends of the conductive strip 114 are respectively electrically connected to the conductive structure 110 and the second conductive layer 108. The first conductive layers 106A, 106B, 106C, 106D between the opposing ends of the conductive strip 114 are electrically insulated from the conductive strip 114 by the dielectric layer 104. The first conductive layers 106A, 106B, 106C, 106D and the second conductive layer 108, of different pages extending along directions parallel to each other (such as a X direction), may be separated from each other by a dielectric structure (not shown).

The conductive structure 110 is disposed above the stacked structure 102, and electrically connected to the conductive strip 114 through a conductive stair 118 and a conductive plug 119. In this embodiment, the conductive structure 110 comprises conductive lines 120 separated from each other and respectively electrically connected to the conductive strips 114 of the same level of the stacked structures 102 of different rows. The conductive strip 114 has a sawtooth shape or a ladder shape, as shown in FIG. 1, or other suitable shapes.

In one embodiment, the conductive strip 114 of the stacked structure 102 is functioned as a bit line (BL). The first conductive layer 106A disposed on a sidewall of the stacked structure 102 and adjacent to the conductive stair 118 is functioned as a string select line (SSL), wherein the conductive strip 114 can be controlled to be in a selected state (or "on" state) or an unselected state (or "off" state) by applying a voltage to the first conductive layer 106A near to the conductive strip 114. The second conductive layer 108 away from the conductive stair 118 is functioned as a common source line (CSL), electrically connected the conductive strips 114 of the stacked structures 102 of different rows. The first conductive layer 106D adjacent to the second conductive layer 108 is functioned as a ground select line (GSL). The first conductive layers 106B, 106C between the first conductive layer 106A and the first conductive layer 106D are functioned as word lines (WL).

In embodiments, quantity of page of the first conductive layers 106B, 106C (WL), row of the stacked structure 102 level of the conductive strip 114, the conductive lines 120 is not limited to that shown in FIG. 1, and may be more or less according to actual demands. In embodiments, a conductive material used may comprise a metal, a polysilicon, a metal silicide, or other suitable materials. A dielectric material used may comprise an oxide, or a nitride, such as silicon oxide, silicon nitride or silicon oxynitride, or other suitable materials.

Figure 2:
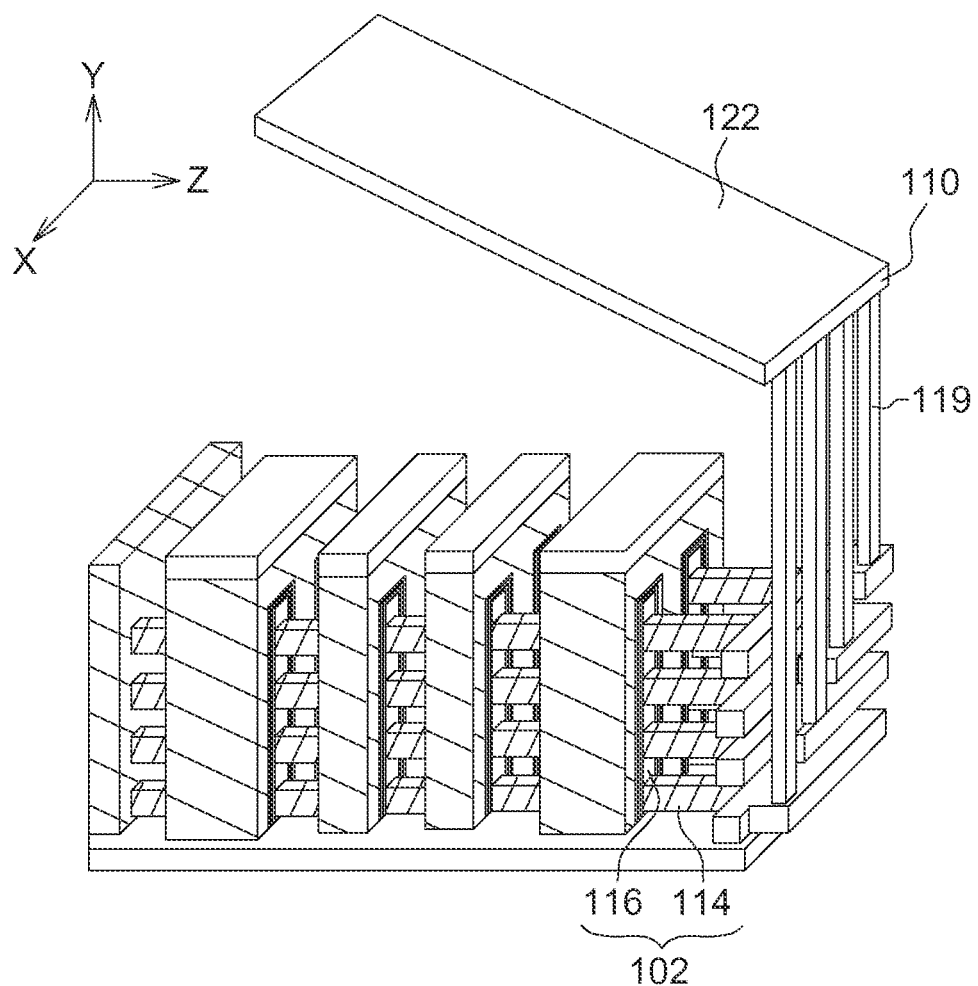
FIG. 2 shows an integrated circuit according to one embodiment.

FIG. 2 shows an integrated circuit according to one embodiment. A difference between the integrated circuits shown in FIG. 1 and FIG. 2 is described in the following. The conductive structure 110 comprises a conductive board 122 having a long axis extended in a direction not parallel to an extending direction of each of the stacked structure 102 (or the conductive strip 114). The conductive board 122 is electrically connected to conductive strips 114 of the same level of different stacked structures 102, and electrically connected to the conductive strips 114 of different levels of each of the stacked structures 102.

Figure 3:
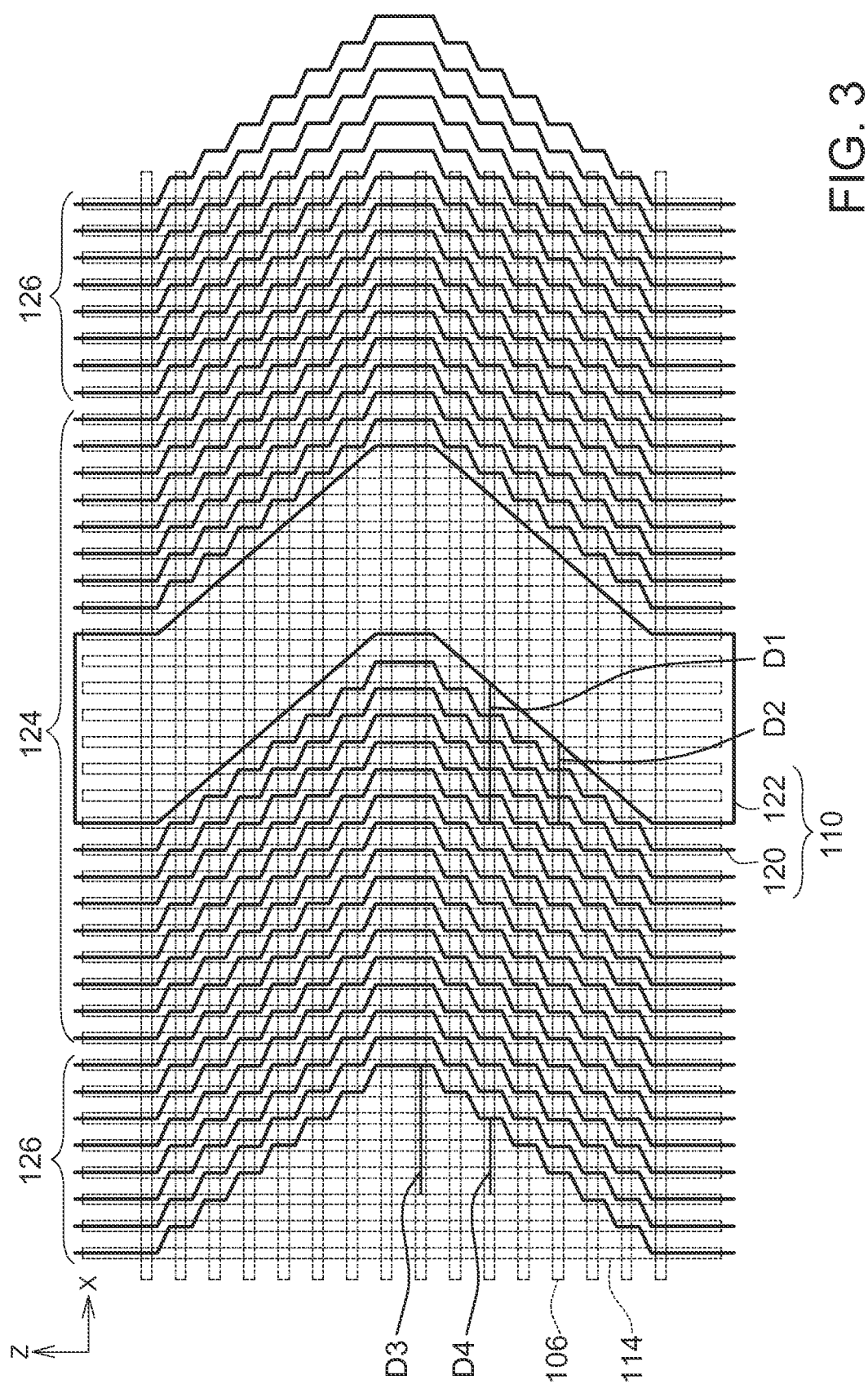
FIG. 3 shows a top view of an integrated circuit according to one embodiment.

FIG. 3 is a top view of an integrated circuit according to one embodiment, which only shows the conductive strip 114, the first conductive layer 106 and the conductive structure 110 for the sake of brevity. The conductive structure 110 comprises the conductive board 122 and the conductive lines 120 separated from each other. The conductive board 122 and the conductive lines 120 are all disposed in the same level (such as a M3 level). An extending direction, such as the X direction, of the first conductive layer 106 and the second conductive layer 108 (FIG. 1) is crisscrossed with an extending direction, such as the Z direction, of the conductive strip 114 of the stacked structure 102 (FIG. 1).

The 3D memory stack comprises a dummy region 124 and a memory region 126 adjacent to each other. In one embodiment, for example, the dummy region 124 is disposed between the memory regions 126. The conductive strips 114 of the memory region 126 and the dummy region 124 adjacent to the memory region 126 are electrically connected to the conductive lines 120 of the conductive structure 110, and this portion of the 3D memory stack is similar with the structure as shown in FIG. 1. The conductive strips 114 of the dummy region 124 away from the memory region 126 are electrically connected to the conductive board 122 of the conductive structure 110, and this portion of the 3D memory stack is similar with the structure as shown in FIG. 2. In one embodiment, the dummy region 124 and the memory region 126 share the single second conductive layer 108 (or the common source line) (FIG. 1 or FIG. 2).

In embodiments, an extending direction of the conductive structure 110 is not parallel to an extending direction of the conductive strip 114, or the integrated circuit is designed to have the dummy region 124, so as to compensate a capacitance difference due to different bit structures, such as different areas of upper surfaces of the conductive stairs 118 as shown in FIG. 1, to average induced capacitance in the integrated circuit. For example, as observed from the top view of FIG. 3, the conductive lines 120 are gradually away from the conductive strip 114 electrically connected thereto, from an end portion to a middle portion. A long edge of the conductive board 122 is gradually away from the conductive strip 114 of the most outside row that is electrically connected to the conductive board 122. Otherwise, the conductive structure 110 and the conductive strip 114 have various gap distances between corresponding points of different pairs according to a basic axis. For example, the conductive board 122 and the conductive strip 114 have various gap distances (for example a gap distance D1 is bigger than a gap distances D2) between the nearest corresponding points of different pairs according to the basic axis (such as the Z axis). In another example, the conductive lines 120 and the conductive strip 114 have various gap distances (for example a gap distance D3 is bigger than a gap distances D4) between the nearest corresponding points of different pairs according to the basic axis (such as the Z axis).

In embodiments, an operating method for the integrated circuit comprises programming, reading and erasing the memory region 126 (FIG. 3) of the 3D memory stack. In operating the memory region 126, a first voltage is applied to the conductive structure 110 of the dummy region 124, and a second voltage is applied to the second conductive layer 108 (FIG. 1) of the dummy region 124, wherein the first voltage is equal to the second voltage.

Please refer FIG. 1 to FIG. 3. For example, a method for programming the memory region 126 comprises following steps. A voltage (such as 0V) is applied to the conductive lines 120. A voltage is applied to the first conductive layer 106A (string select line; SSL) to make the conductive strip 114 in a selected (or "on") state. A pass voltage (Vpass) and a program voltage (Vpgm) are applied to the first conductive layers 106B, 106C (or word lines) of different pages. A voltage is applied to the first conductive layer 106D (or ground select line; GSL), to make the conductive strip 114 in an unselected (or "off") state. A voltage (such as a supply voltage Vcc) is applied to the second conductive layer 108 (or common source line CSL).

During the step for programming the memory region 126, the dummy region 124 is not programmed by a method described as the following. The same (first) voltage (such as the supply voltage Vcc) is applied to the first conductive layer 106A of the dummy region 124 and the conductive structure 110 (conductive lines 120 or conductive board 122). In one embodiment, for example, the first conductive layer 106A of the dummy region 124 and a portion of the conductive strip 114 near to the conductive structure 110 are shorted by a conductive element (such as a metal layer which is not shown), so that a common (first) voltage (from the conductive structure 110) may be applied to the first conductive layer 106A and the conductive strip 114 at the same time. The dummy region 124 and the memory region 126 share the common first conductive layers 106B, 106C (word lines), therefore a voltage applied to the first conductive layers 106B, 106C of the dummy region 124 is equal to that of the memory region 126. The same (second) voltage (such as the supply voltage Vcc) is applied to the first conductive layer 106D and the second conductive layer 108 of the dummy region 124. In one embodiment, for example, the first conductive layer 106D and the second conductive layer 108 of the dummy region 124 are short by through a conductive element (such as a metal layer, which is not shown), so that a common (second) voltage may be applied to the first conductive layer 106D and the second conductive layer 108 at the same time.

A method for reading the memory region 126 comprises following steps. A voltage (such as 1V) is applied to the conductive lines 120. A voltage (such as the supply voltage Vcc) is applied to the first conductive layer 106A (or the string select line SSL), to make the conductive strip 114 in "on" state. A pass voltage Vpass is applied to the first conductive layers 106B, 106C (word lines). A voltage (such as the supply voltage Vcc) is applied to the first conductive layer 106D (ground select line GSL) to make the conductive strip 114 in "on" state. A voltage (such as a ground) is applied to the second conductive layer 108 (common source line; CSL).

During the step for reading the memory region 126, the dummy region 124 is not sensed by a method as described as following. The same (first) voltage (such as 0V) is applied to the first conductive layer 106A and the conductive structure 110 (conductive lines 120 or conductive board 122) of the dummy region 124. The same (second) voltage (such as 0V or a ground) is applied to the first conductive layer 106D and the second conductive layer 108 of the dummy region 124.

A method for erasing the memory region 126 comprises following steps. A voltage (such as 14V) is applied to the conductive lines 120. A voltage is applied to the first conductive layer 106A (string select line SSL) to make the conductive strip 114 in "on" state. A voltage (such as 0V) is applied to the first conductive layers 106B, 106C (word lines). A voltage is applied to the first conductive layer 106D (ground select line GSL) to make the conductive strip 114 in "on" state. A voltage (such as 14V) is applied to the second conductive layer 108 (common source line CSL).

During erasing the memory region 126, the dummy region 124 is erased by a method described as following. The same erasing bias (such as 14V) is applied to the first conductive layer 106A and the conductive structure 110 (conductive lines 120 or conductive board 122) of the dummy region 124. The same (second) voltage (such as 14V or a ground) is applied to the first conductive layer 106D and the second conductive layer 108 of the dummy region 124.

Figure 4:
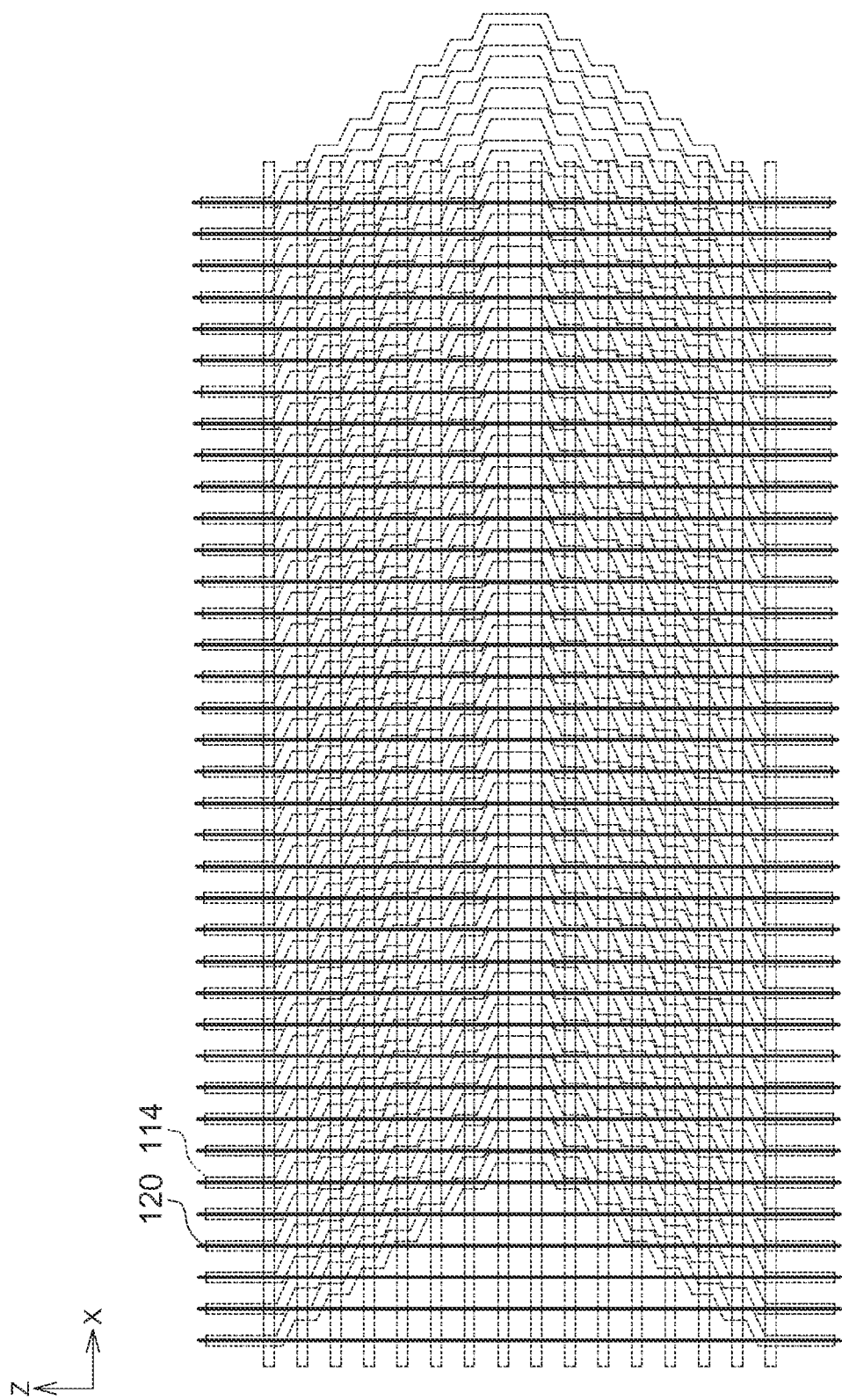
FIG. 4 shows a top view of an integrated circuit according to one embodiment.

FIG. 4 is a top view of an integrated circuit according to one embodiment. A difference between the integrated circuits of FIG. 3 and FIG. 4 is described as the following. An extending direction (such as along the X direction) of the first conductive layer 106 is crisscrossed with an extending direction (such as along the Z direction) of the conductive lines 120. The conductive strip 114 of the stacked structure 102 has a sawtooth or ladder shape. In addition, an extending direction of the conductive strip 114 is not parallel to that of the conductive lines 120.

Figure 5:
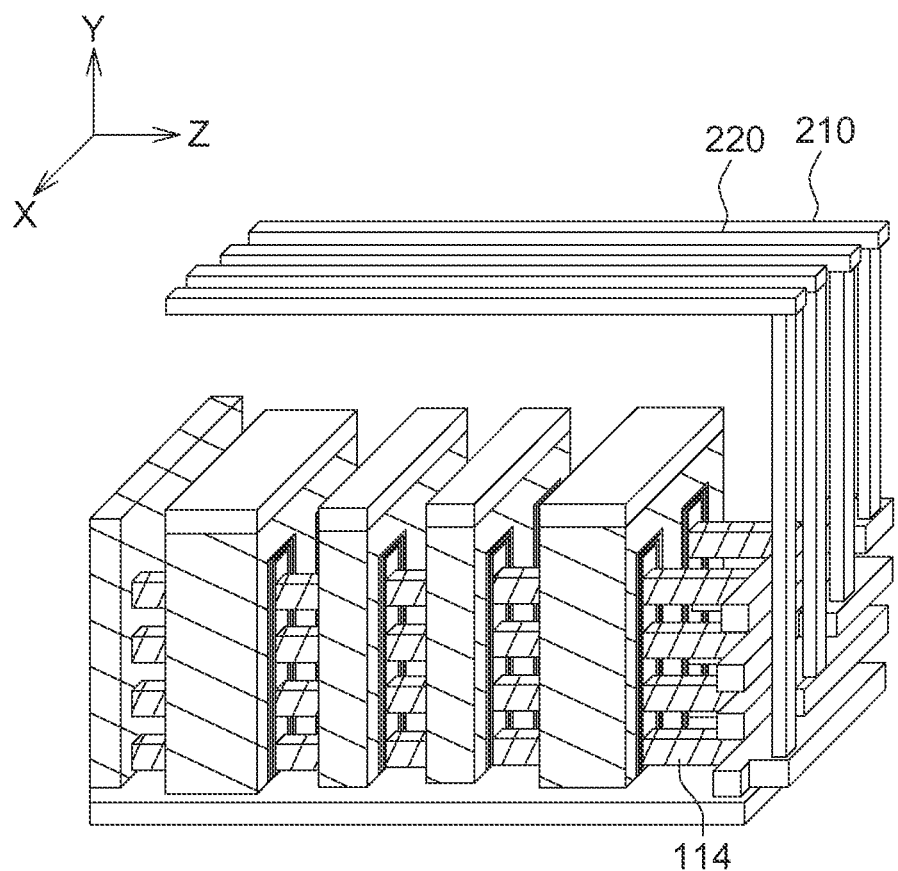
FIG. 5 shows an integrated circuit according to a comparative example.

FIG. 5 shows an integrated circuit of a comparative example, which is different from the integrated circuit of the embodiment in that a conductive structure 210 is a conductive line 220 extended in a direction parallel to an extending direction of the conductive strip 114. Compared to the comparative example, the embodiment in which the extending directions of the conductive structure 110 and the conductive strip 114 are not parallel to each other has more average sensed capacitances.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated circuit, comprising:
a 3D stack comprising a dummy region and a memory region, wherein each of the dummy region and the memory region comprises a stacked structure having a plurality of a conductive strips and comprises:
a conductive structure above the stacked structure comprising a plurality conductive lines and a conductive board, wherein portions of the conductive strips disposed in the memory region are electrically connected to one portion of the conductive lines, portions of the conductive strips disposed in the dummy region are electrically connected to the conductive board, wherein the conductive structure and the conductive strip have various gap distances between corresponding points of different pairs according to a basic axis; and
a plurality of first conductive layers electrically insulated from and crisscrossed with the conductive strips, wherein a portion of the first conductive layer disposed in the dummy region and portions of the conductive strips near to the conductive structure are shorted by a conductive element.

2. The integrated circuit according to claim 1, wherein an extending direction of the conductive structure is not parallel to an extending direction of the conductive strips.

3. The integrated circuit according to claim 1, wherein the 3D memory stack further comprising
a plurality of dielectric layers
electrically insulated the first conductive layers from the conductive strips.

4. The integrated circuit according to claim 3, wherein one of the conductive strips of the stacked structure is functioned as a bit line (BL), one of the first conductive layer is functioned as a word line (WL), a string select line (SSL) or a ground select line (GSL), the 3D memory stack further comprises a common source line (CSL); opposing ends of the bit lines are electrically connected to the conductive structure and the common source line respectively.

5. The integrated circuit according to claim 1, wherein the conductive board and the conductive lines are separated from each other and all disposed in the same level.

6. The integrated circuit according to claim 1, wherein the conductive board and the conductive strips have various gap distances between the nearest corresponding points of different pairs according to the basic axis.

7. The integrated circuit according to claim 1, wherein the conductive board electrically connected to the conductive strip in the same level of the different stacked structures, and electrically connected to the conductive strips in different levels of each of the stacked structures.

8. The integrated circuit according to claim 1, wherein one of the conductive lines and one of the conductive strips have various gap distances between the nearest corresponding points of different pairs according to the basic axis.

9. The integrated circuit according to claim 1, wherein the conductive lines are electrically connected to the conductive strips in the same level of the different stacked structures.

10. The integrated circuit according to claim 1, wherein each of the conductive lines has a sawtooth shape or a ladder shape, each of the conductive strips has a straight strip shape.

11. The integrated circuit according to claim 1, further comprising:
a plurality of conductive stairs; and a plurality of conductive plugs, wherein the conductive strips are electrically connected to the conductive structure through the conductive stairs and the conductive plugs.

12. The integrated circuit according to claim 11, wherein the conductive stairs respectively have different areas.

13. The integrated circuit according to claim 1, wherein the 3D memory stack further comprises:
    a dielectric layer;
    a ground select line; and
    a common source line, wherein the ground select line is electrically insulated from the conductive strips of the stacked structure by the dielectric layer, the ground select line is crisscrossed with the conductive strips, the ground select line and the common source line have a short circuit therebetween.

14. The integrated circuit according to claim 1, wherein the 3D memory stack comprises:
    a dielectric layer; and
    a string select line on a sidewall of the stacked structure and separated from the conductive strips of the stacked structure by the dielectric layer, the string select line and the conductive strips have a short circuit therebetween.

* * * * *